(12) United States Patent
Jeong et al.

(10) Patent No.: US 11,233,165 B2
(45) Date of Patent: Jan. 25, 2022

(54) MULTI-JUNCTION SOLAR CELL AND MANUFACTURING METHOD OF THE SAME

(71) Applicant: KOREA INSTITUTE OF SCIENCE AND TECHNOLOGY, Seoul (KR)

(72) Inventors: Jeung Hyun Jeong, Seoul (KR); In Ho Kim, Seoul (KR); Won Mok Kim, Seoul (KR); Jong Keuk Park, Seoul (KR); Hyeong Geun Yu, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 145 days.

(21) Appl. No.: 16/366,111

(22) Filed: Mar. 27, 2019

(65) Prior Publication Data
US 2020/0274015 A1 Aug. 27, 2020

(30) Foreign Application Priority Data

Feb. 27, 2019 (KR) ........................ 10-2019-0023352

(51) Int. Cl.
| | |
|---|---|
| *H01L 31/0725* | (2012.01) |
| *H01L 31/074* | (2012.01) |
| *H01L 31/0749* | (2012.01) |
| *H01L 31/0224* | (2006.01) |
| *H01L 31/0352* | (2006.01) |
| *H01L 31/18* | (2006.01) |
| *B23K 26/00* | (2014.01) |
| *B23K 26/06* | (2014.01) |
| *B23K 26/0622* | (2014.01) |

(Continued)

(52) U.S. Cl.
CPC ...... *H01L 31/0725* (2013.01); *B23K 26/0006* (2013.01); *B23K 26/0604* (2013.01); *B23K 26/0624* (2015.10); *B23K 26/53* (2015.10); *H01L 31/022466* (2013.01); *H01L 31/035281* (2013.01); *H01L 31/074* (2013.01); *H01L 31/0749* (2013.01); *H01L 31/1864* (2013.01); *H01L 31/1884* (2013.01); *B23K 2101/40* (2018.08)

(58) Field of Classification Search
CPC ............ H01L 31/0463; H01L 31/0725; H01L 31/076
See application file for complete search history.

(56) References Cited

U.S. PATENT DOCUMENTS

| | | | |
|---|---|---|---|
| 9,349,905 B2* | 5/2016 | Woods | H01L 31/0336 |
| 2014/0273329 A1* | 9/2014 | Yang | H01L 31/0463 |
| | | | 438/68 |

(Continued)

FOREIGN PATENT DOCUMENTS

| | | |
|---|---|---|
| CN | 104091849 A | 10/2014 |
| KR | 1020100030944 A | 3/2010 |

*Primary Examiner* — Mayla Gonzalez Ramos
(74) *Attorney, Agent, or Firm* — Rabin & Berdo, P.C.

(57) ABSTRACT

Provided is a multi-junction solar cell in which two or more absorption layers having different bandgaps are stacked on one another. The multi-junction solar cell includes a first cell including a first absorption layer, and a second cell electrically connected in series onto the first cell, wherein the second cell includes a second absorption layer having a higher bandgap compared to the first absorption layer, and a plurality of recesses penetrating through the second absorption layer.

10 Claims, 13 Drawing Sheets

(51) Int. Cl.
*B23K 26/53* (2014.01)
*B23K 101/40* (2006.01)

(56) References Cited

U.S. PATENT DOCUMENTS

2015/0083186 A1* 3/2015 Shibasaki ............. H01L 31/043
 136/244
2018/0374977 A1 12/2018 Geerligs et al.

* cited by examiner

MULTI-JUNCTION SOLAR CELL AND MANUFACTURING METHOD OF THE SAME

CROSS-REFERENCE TO RELATED PATENT APPLICATION

This application claims the benefit of Korean Patent Application No. 10-2019-0023352, filed on Feb. 27, 2019, in the Korean Intellectual Property Office, the disclosure of which is incorporated herein in its entirety by reference.

BACKGROUND

1. Field

The present invention relates to a multi-junction solar cell and a method of manufacturing the same and, more particularly, to a multi-junction solar cell in which two or more absorption layers having different bandgaps are stacked on one another, and a method of manufacturing the same.

2. Description of the Related Art

In addition to the necessity of replacing limited fossil fuels with new renewable energy sources in terms of energy resources, the necessity of environment-friendly energy sources is currently increasing because of serious environmental problems such as fine dust and climate change due to global warming. The solar cell market, which best meets the necessities, is rapidly growing in USA, Europe, Japan, China, the Middle East, etc., and silicon (Si) solar cells, which are highly comparative in a high efficiency and a low price, occupy more than 90% of the total market.

Crystalline Si solar cells have been improved to a photoelectric conversion efficiency of 23% to 24% by employing a price-competitive sandwich cell structure (bottom electrode/Si/top electrode) by using a selective contact technique and a front/back surface passivation technique. However, to achieve a photoelectric conversion efficiency equal to or higher than 25%, a complicated and high-cost process technique such as an interdigitated back contact (IBC) technique for providing front and back electrodes on a single surface or a heterojunction with intrinsic thin-layer (HIT) technique using amorphous Si thin-film passivation needs to be used. A hybrid multi-junction solar cell manufactured merely by sequentially stacking a high-bandgap thin-film and a transparent electrode on a general sandwich-type crystalline Si cell structure is remarkable because a high price-competitiveness and a high efficiency equal to or higher than 30% may be achieved and the existing Si industrial system may be utilized. In the multi-junction solar cell, two or more absorption layers having different bandgaps are stacked one another and a high-energy wavelength band and a low-energy wavelength band incident on the same space are absorbed by different absorption layers and are converted into electricity. A solar cell having a higher bandgap may generate a high voltage, and thus a higher photoelectric conversion efficiency compared to a single-junction solar cell may be expected. Due to serial connection between the two solar cells in this structure, the solar cells need to produce equal photocurrents to minimize energy loss.

Currently, a hybrid multi-junction solar cell in which a perovskite thin-film solar cell capable of easily achieving a high efficiency through a simple manufacturing process is stacked on a crystalline Si cell structure attracts attention. A perovskite absorption layer has a high and easily-controllable bandgap and thus is appropriate for a top cell of the hybrid multi-junction solar cell. However, the perovskite absorption layer is unstable in light, moisture, heat, and electricity and thus the stability problem thereof needs to be solved before being used in products.

Interests in a hybrid multi-junction solar cell including a top cell as a chalcogenide solar cell using, for example, $Cu(In_{1-x},Ga_x)(Se_y,S_{1-y})_2$ (CIGS) having a high environmental stability are also increasing. A chalcogenide is a compound including a chalcogen element such as sulfur (S), selenium (Se), or tellurium (Te) and examples thereof include $CuInSe_2$ (CIS), $Cu(In_{1-x},Ga_x)(Se_y,S_{1-y})_2$ (CIGS), and $CuGaSe_2$ (CGS). A CIGS thin-film solar cell having a high absorbance and excellent semiconductor properties is capable of achieving a high photoelectric conversion efficiency and thus is expected as a next-generation low-price high-efficiency solar cell. A CIGS thin-film material may be freely changed in bandgap by changing a Ga/(In+Ga) ratio or a Se/(Se+S) radio, and thus is appropriately used for a top cell absorption layer of the hybrid multi-junction solar cell. In particular, a bandgap of a Se-based solar cell may be controlled from 1.0 eV to 1.7 eV based on an In/(In+Ga) radio. A $Cu(In_{1-x},Ga_x)(Se,S)_2$ absorption layer serving as a core element of the CIGS thin-film solar cell may be generated using various thin-film vacuum deposition methods such as a co-evaporation method and a sputtering-selenization method which are already used for large-area production.

As illustrated in FIG. 10A, to implement a Si-chalcogenide thin-film hybrid multi-junction solar cell 600, a first transparent electrode layer 40, a second absorption layer 50, a buffer layer 60, a second transparent electrode layer 70, and a metal grid pattern 80 need to be sequentially stacked on a structure in which a back electrode 10, a first absorption layer 20, and an emitter layer 30 are sequentially stacked on one another.

Herein, the first transparent electrode layer 40 may include one selected from among aluminum-doped zinc oxide (AZO), boron-doped zinc oxide (BZO), fluorine-doped tin oxide (FTO), indium tin oxide (ITO), and indium oxide (IO), and be generated using sputtering. Herein, the first transparent electrode layer 40 located between a top solar cell and a bottom solar cell serves as a recombination layer and thus includes a combination of n++ and p++ materials. The buffer layer 60 may include one selected from among CdS, Zn(S,O), ZnSnO, ZnMgO, and i-ZnO, and be synthesized using sputtering or atomic layer deposition. The second transparent electrode layer 70 may include the same material as the first transparent electrode layer 40. In some cases, the second transparent electrode layer 70 may include one selected from among the above-listed materials.

The material of the chalcogenide thin-film solar cell is applicable to a high-productivity process, has a high process consistency with the Si solar cell, and is appropriate for large-scale production. Due to the high process consistency and high material stability, the technology of the Si-chalcogenide hybrid multi-junction solar cell 600 is highly usable in terms of industrial application. However, to achieve a high high-efficiency of the multi-junction solar cell 600, a high-efficiency of the Si solar cell serving as a bottom cell, a high-efficiency of the chalcogenide solar cell serving as the top cell, and loss suppression in a recombination layer interconnecting the top and bottom cells are required. In addition, due to serial connection between the top and bottom cells, an optical design for controlling absorbances of the cells in such a manner that the cells generate equal photocurrents (i.e., to achieve photocurrent matching) is required.

Two technical problems hinder photocurrent matching in the multi-junction solar cell 600. First, when an absorption layer for a top cell has a lower bandgap compared to a bottom cell (e.g., perovskite cell bandgap: 1.55 eV to 1.6 eV, CGSe cell bandgap: 1.68 eV), an absorbance of the top cell is excessively high and thus sufficient light may not be easily absorbed into the bottom cell.

FIG. 10B is a graph showing external quantum efficiency (EQE) spectrums of a top cell and a bottom cell, and EQE refers to a photoelectric conversion (light-receiving) quantum efficiency (e.g., a ratio of the number of converted (emitted) electrons to the number of incident photons).

Referring to FIG. 10B, when a top cell uses an absorption layer having a thickness equal to or greater than 0.5 µm to achieve a sufficient absorbance, in an infrared (IR) wavelength band passing through the absorption layer, severe reflection occurs on a surface and an interface of the stack structure of the first absorption layer 20, the first transparent electrode layer 40, the second absorption layer 50, and the second transparent electrode layer 70 and thus the bottom cell achieves an insufficient absorbance. As a result, since a photocurrent (e.g., 14.5 mA/cm) of the bottom cell is lower than a photocurrent (17.9 mA/cm) of the top cell, a photocurrent of the multi-junction cell is limited by the bottom cell and thus efficiency loss is increased a lot.

SUMMARY

The present invention provides a method of manufacturing a hybrid multi-junction solar cell in which a high-bandgap thin-film solar cell is stacked on a silicon (Si) solar cell, the method being capable of solving photocurrent mismatching between top and bottom cells due to an insufficient photocurrent of the Si solar cell serving as the bottom cell, and a hybrid multi-junction solar cell manufactured using the method. However, the scope of the present invention is not limited thereto.

According to an aspect of the present invention, there is provided a multi-junction solar cell in which two or more absorption layers having different bandgaps are stacked on one another, the multi-junction solar cell including a first cell including a first absorption layer, and a second cell electrically connected in series onto the first cell, wherein the second cell includes a second absorption layer having a higher bandgap compared to the first absorption layer, and a plurality of recesses penetrating through the second absorption layer.

The first cell may include a silicon (Si) solar cell.

The second cell may include a chalcogenide-based solar cell.

The first and second cells may be stacked on one another by a first transparent electrode layer, and at least parts of the first transparent electrode layer or at least parts of an emitter layer may be exposed by the plurality of recesses.

The plurality of recesses may be designed to have a diameter in such a manner that the first and second cells generate equal photocurrents.

The plurality of recesses may penetrate through both of a buffer layer generated on the second absorption layer, and a second transparent electrode layer generated on the buffer layer, and a removal area of the second transparent electrode layer may be greater than or equal to a removal area of the second absorption layer.

According to another aspect of the present invention, there is provided a method of manufacturing a multi-junction solar cell in which two or more absorption layers having different bandgaps are stacked on one another, the method including generating, on a back electrode, a first cell including a first absorption layer, and generating a second cell electrically connected in series onto the first cell, wherein the generating of the second cell includes generating a second absorption layer having a higher bandgap compared to the first absorption layer, and generating a plurality of recesses penetrating through the second absorption layer.

The generating of the plurality of recesses may include irradiating laser beams having a wavelength band absorbed by the second absorption layer, onto at least partial regions of a buffer layer and a second transparent electrode layer sequentially stacked on the second absorption layer, to remove the buffer layer and the second transparent electrode layer, and irradiating the laser beams onto the second absorption layer exposed by the removed buffer layer and the second transparent electrode layer, to remove the second absorption layer.

The laser beams may have a wavelength band equal to or lower than 700 nm.

The laser beams may have a wavelength band equal to or lower than 550 nm.

The laser beams may include pulsed laser beams having a pulse range from 2 picoseconds (ps) to 100 ps.

The generating of the plurality of recesses may include irradiating laser beams having a wavelength band transmitted through the second absorption layer, onto at least partial regions of a buffer layer and a second transparent electrode layer sequentially stacked on the second absorption layer, to remove the second absorption layer, the buffer layer, and the second transparent electrode layer.

The laser beams may have a wavelength band equal to or higher than 800 nm.

The laser beams may have a wavelength band equal to or higher than 950 nm.

The generating of the plurality of recesses may include generating and patterning a first transparent electrode layer on the first cell before the second absorption layer is generated, sequentially depositing the second absorption layer, a buffer layer, and a second transparent electrode layer on the patterned first transparent electrode layer and the first cell exposed due to the patterning, and generating the plurality of recesses by selectively removing the second absorption layer by de-bonding an interface between the first cell from the second absorption layer due to a process performed in the sequential depositing.

BRIEF DESCRIPTION OF THE DRAWINGS

The above and other features and advantages of the present invention will become more apparent by describing in detail embodiments thereof with reference to the attached drawings in which.

DETAILED DESCRIPTION

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art.

As used herein, a first cell refers to a bottom cell of a multi-junction solar cell, and a second cell refers to a top cell thereof.

Figure 1A:
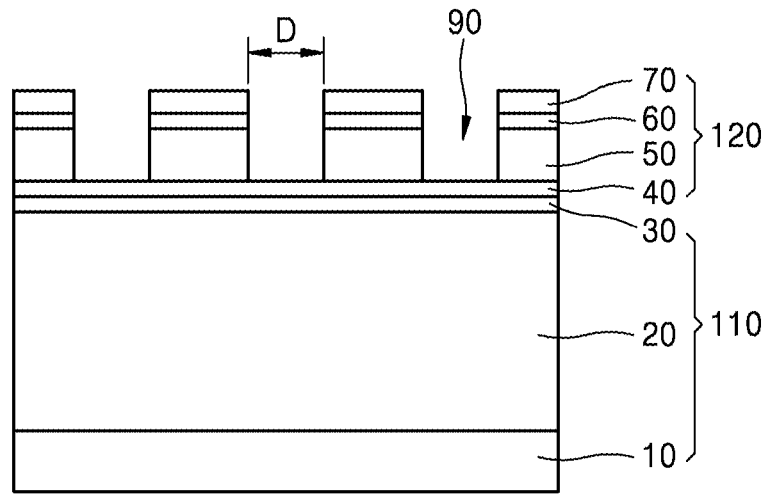
FIGS. 1A and 1B are a cross-sectional view and a plan view of a multi-junction solar cell according to an embodiment of the present invention.
Figure 1B:
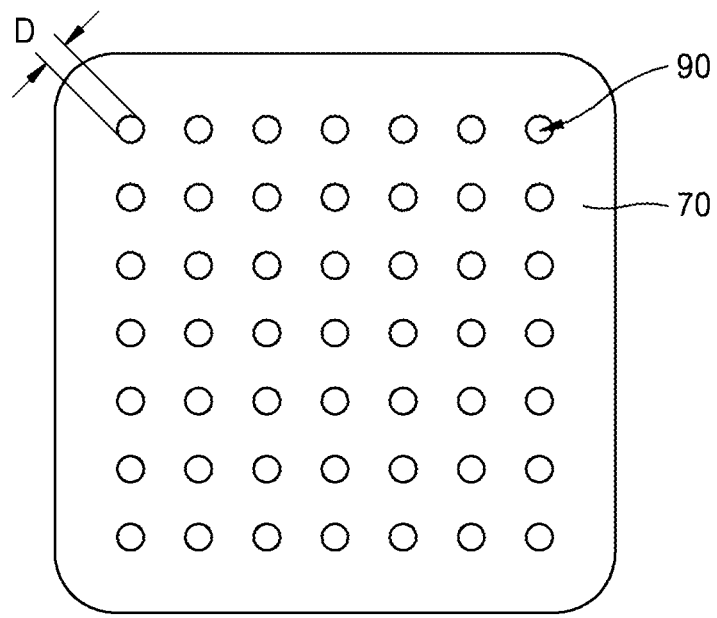

FIGS. 1A and 1B are a cross-sectional view and a plan view of a multi-junction solar cell 100 according to an embodiment of the present invention.

Referring to FIG. 1A, the multi-junction solar cell 100 in which two or more absorption layers (e.g., first and second absorption layers 20 and 50) having different bandgaps are stacked on one another includes a first cell 110 including the first absorption layer 20, and a second cell 120 electrically connected in series onto the first cell 110. The second cell 120 includes the second absorption layer 50 having a higher bandgap compared to the first absorption layer 20, and a plurality of recesses 90 penetrating through the second absorption layer 50. The first and second cells 110 and 120 are stacked on one another by a first transparent electrode layer 40.

For example, the first cell 110 includes a silicon (Si) solar cell. The second cell 120 may include a chalcogenide-based solar cell.

A back electrode 10 including aluminum (Al) or silver (Ag) is provided on a surface of the first cell 110, and the other surface thereof is n-doped and then the first transparent electrode layer 40 is deposited thereon. A selenium (Se)-, sulfur (S)-, or tellurium (Te)-based chalcogenide-based absorption layer serving as the second absorption layer 50, a buffer layer 60, and a second transparent electrode layer 70 are sequentially deposited thereon to manufacture the multi-junction solar cell 100. Herein, the first cell 110 may serve as a p-type Si solar cell or an n-type Si solar cell depending on the type of doping. Although not shown in FIG. 1A, at least one surface of the first cell 110 may be textured to scatter light.

The first transparent electrode layer 40 may be made of, for example, indium tin oxide (ITO), fluorine-doped tin oxide (FTO), aluminum-doped zinc oxide (AZO), or boron-doped zinc oxide (BZO), and have a layered structure of two or more oxide thin-films. The first transparent electrode layer 40 may have a thickness equal to or less than 100 nm, preferably, a thickness equal to or less than 50 nm, and more preferably, a thickness equal to or less than 20 nm. The second transparent electrode layer 70 may use the same material as the first transparent electrode layer 40. In some cases, the second transparent electrode layer 70 may be made of one of the above-listed materials.

The second absorption layer 50 may include copper (Cu), silver (Ag), gallium (Ga), or indium (In), and have a bandgap of 1.4 eV to 1.7 eV and a thickness equal to or greater than 0.5 μm, and preferably, a thickness equal to or greater than 1.0 μm.

Thereafter, at least a part of the second absorption layer 50, the buffer layer 60, and the second transparent electrode layer 70 is removed such that solar light is not absorbed into the second cell 120 but is absorbed into the first cell 110 in a region corresponding to the removed part.

Referring to FIG. 1B, the plurality of recesses 90 may have a circular shape or any other shape and may be aligned at equal intervals. Herein, the plurality of recesses 90 may have a diameter D designed in such a manner that the first and second cells 110 and 120 generate equal photocurrents. The plurality of recesses 90 penetrate through both of the buffer layer 60 generated on the second absorption layer 50, and the second transparent electrode layer 70 generated on the buffer layer 60.

The first transparent electrode layer 40 is exposed by the plurality of recesses 90. However, depending on a manufacturing process, the first transparent electrode layer 40 may be partially or completely removed by the plurality of recesses 90. When the first transparent electrode layer 40 is partially removed, remaining parts of the first transparent electrode layer 40 are exposed. When the first transparent electrode layer 40 is completely removed, parts of an emitter layer 30 are exposed. In this case, to constantly maintain photocurrent collection efficiency of the first cell 110 in the recesses 90, at least ½ of an initially deposited thickness of the Si doping layer, i.e., the emitter layer 30, needs to be remained.

Figure 2A:
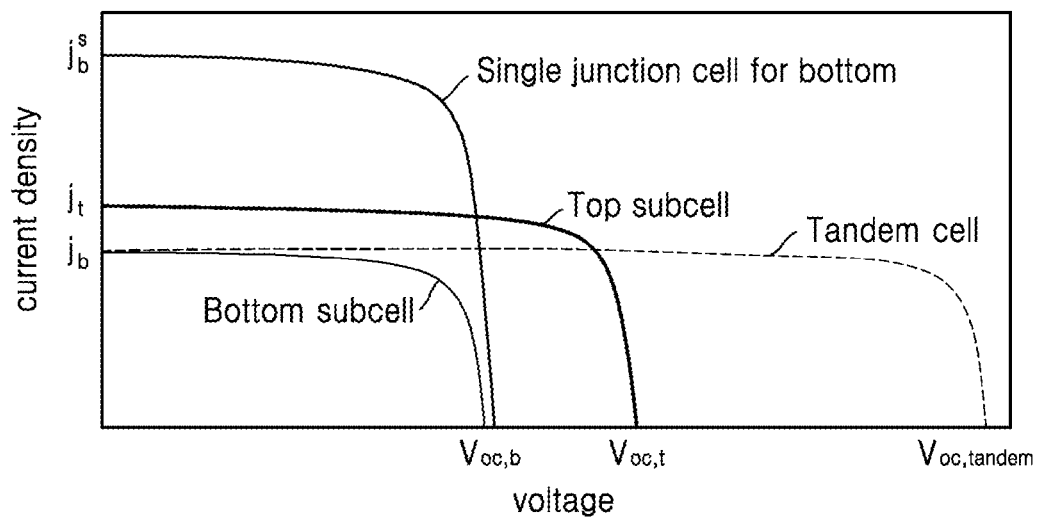
FIGS. 2A and 2B are graphs showing current density-voltage curves of multi-junction solar cells according to a comparative example and an embodiment of the present invention.
Figure 2B:
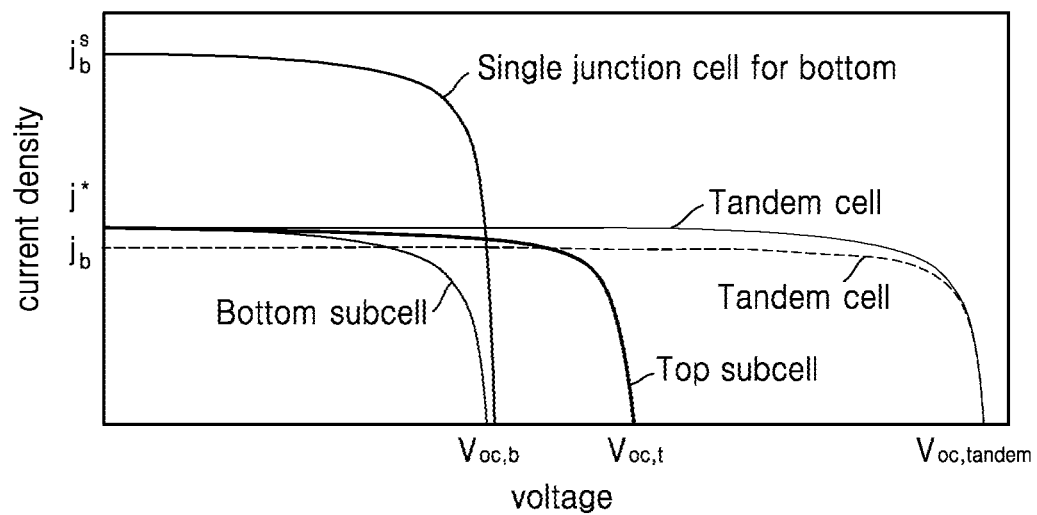

FIGS. 2A and 2B are graphs showing current density-voltage curves of multi-junction solar cells according to a comparative example and an embodiment of the present invention.

Referring to FIG. 2A, when a photocurrent $j_t$ of a top cell is higher than a photocurrent $j_b$ of a bottom cell, a photocurrent of a multi-junction solar cell is limited to the lower photocurrent $j_b$ due to serial connection between the two solar cells. On the other hand, referring to FIG. 2B, when an absorbance region of a top cell (i.e., a second cell) is removed by a certain fraction f, absorbance of the top cell is reduced and thus a photocurrent thereof is reduced, and absorbance of a bottom cell (i.e., a first cell) is increased correspondingly and thus a photocurrent thereof is increased.

The photocurrents after the absorbance region of the top cell is removed by f may be determined as shown in Expressions 1 and 2.

Top cell: $j_t \times (1-f)$ <Expression 1>

Bottom cell: $j_b \times (1-f) + j_b^s \times f$ <Expression 2>

Herein, $j_b{}^s$ denotes a photocurrent of the bottom cell (i.e., the first cell) as a single cell. The photocurrent of the top cell needs to be equal to the photocurrent of the bottom cell in Expressions 1 and 2, the fraction f of the removal region may be determined as shown in Equation 3.

$$f=(j_t-j_b)/(j_t-j_b+j_b{}^s)  \qquad \text{<Equation 3>}$$

As such, a photocurrent of a multi-junction solar cell is increased from $j_b$ to $j^*$ and thus photoelectric conversion efficiency is increased.

Figure 3A:
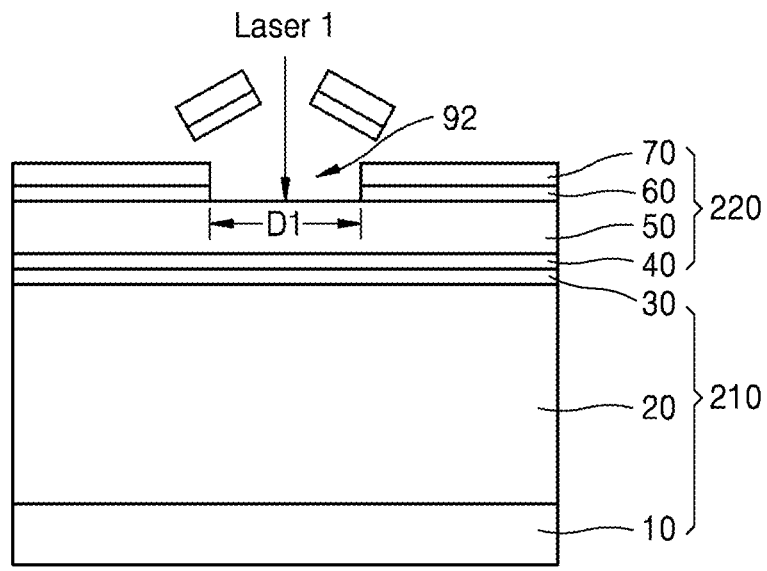
FIGS. 3A to 3C are cross-sectional views for describing a method of manufacturing a multi-junction solar cell, according to an embodiment of the present invention.
Figure 3B:
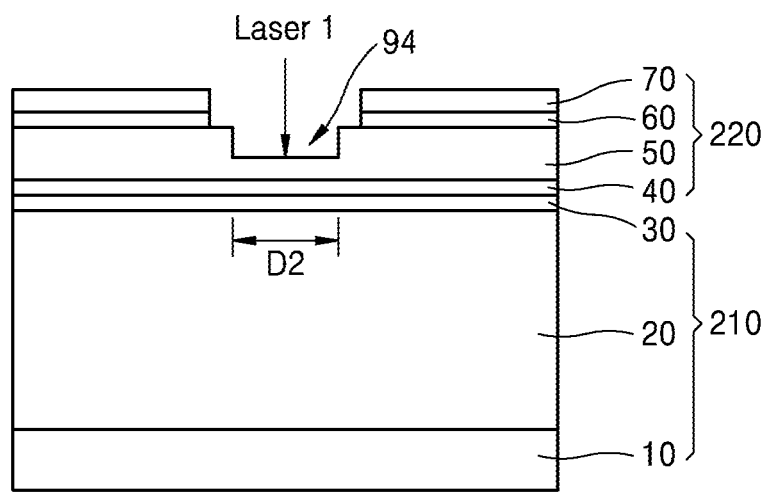
Figure 3C:
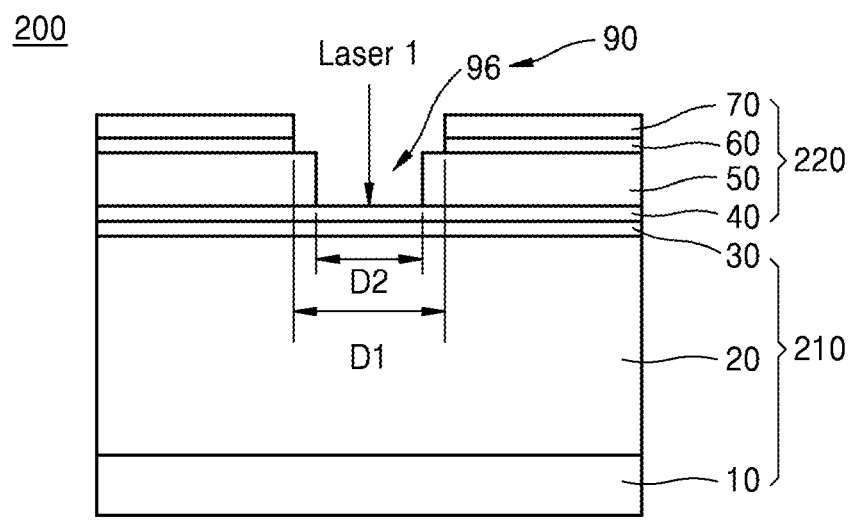

FIGS. 3A to 3C are cross-sectional views for describing a method of manufacturing a multi-junction solar cell 200, according to an embodiment of the present invention.

Referring to FIG. 3A, a first recess 92 is generated by irradiating picosecond (ps) pulsed laser beams having a wavelength band equal to or lower than 700 nm corresponding to a short-wavelength band absorbed by the second absorption layer 50, and preferably, a wavelength band equal to or lower than 550 nm, e.g., 532 nm, onto a region D1 of the second transparent electrode layer 70. Laser beams Laser1 may pass through the second transparent electrode layer 70, be locally absorbed into the surface of the second absorption layer 50, and induce thermal expansion to selectively remove the second transparent electrode layer 70. A removal area of the second transparent electrode layer 70 is greater than a removal area of the second absorption layer 50 because a laser beam condition for removing the second transparent electrode layer 70 is different from a laser beam condition for removing the second absorption layer 50 and damage of the emitter layer 30 of a first cell 210 may be caused using the latter laser beam condition.

Referring to FIGS. 3B and 3C, a second recess 94 is generated by thermally vaporizing and removing the second absorption layer 50 by repeatedly irradiating a plurality of low-energy pulsed laser beams onto a region D2 smaller than the region D1.

In this case, the first transparent electrode layer 40 under the second absorption layer 50 has a very low absorbance at a wavelength band of 532 nm, and the emitter layer 30 thereunder also has a low absorbance. Therefore, by repeatedly irradiating low-energy laser beams, a third recess 96 may be generated by removing the second absorption layer 50 without damaging the first transparent electrode layer 40 and the emitter layer 30. In this case, the first transparent electrode layer 40 may be partially or completely removed.

Vaporization of the second absorption layer 50 may be induced by irradiating low-energy laser beams and the second absorption layer 50 may be gradually removed as illustrated in FIGS. 3A to 3C by repeatedly irradiating the low-energy laser beams onto the same region. When the removal of the second absorption layer 50 is completed as illustrated in FIG. 3C, the irradiated laser beams pass through the first transparent electrode layer 40 and are absorbed by the first absorption layer 20. An absorption coefficient of the first absorption layer 20 is remarkably lower than that of the second absorption layer 50 (<1/50) and thus damage of the first absorption layer 20 by the laser beams may be avoided. In some cases, delamination of the first transparent electrode layer 40 may be caused by thermal expansion due to the laser beams absorbed by the first absorption layer 20. The low-energy laser beams may minimize interference of a vaporized material.

Herein, the region D2 may have a diameter similar to that of the laser beams when the laser beams are simply overlapped, or have a diameter greater than that of the laser beams when the laser beams are irradiated while moving in a spiral shape. The laser beams may have a pulse range of 2 ps to 100 ps and a pulse overlap ratio of 80% to 100%.

When short-wavelength ps pulsed laser beams are used, by removing the region D1 of the second transparent electrode layer 70 to be larger than and prior to removal of the region D2 of the second absorption layer 50, damage of the emitter layer 30 of the bottom cell due to laser heating may be prevented.

Figure 4:
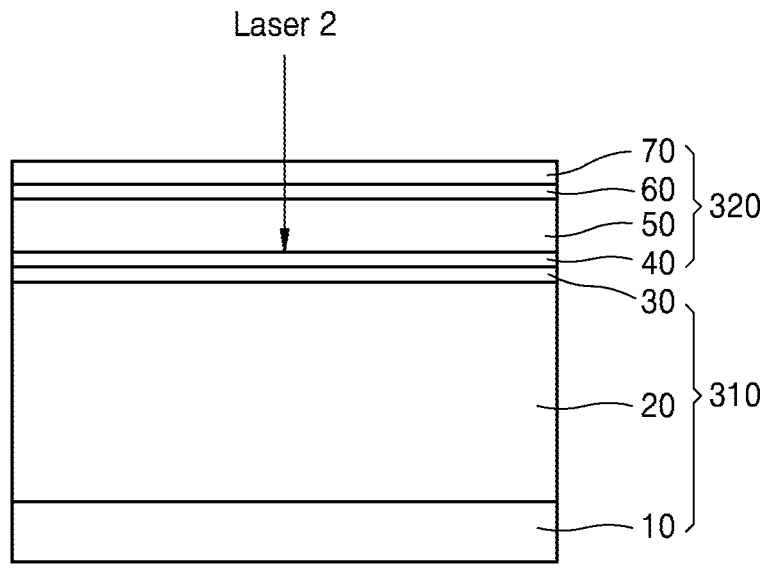
FIG. 4 is a cross-sectional view for describing a method of manufacturing a multi-junction solar cell, according to another embodiment of the present invention.
Figure 4:
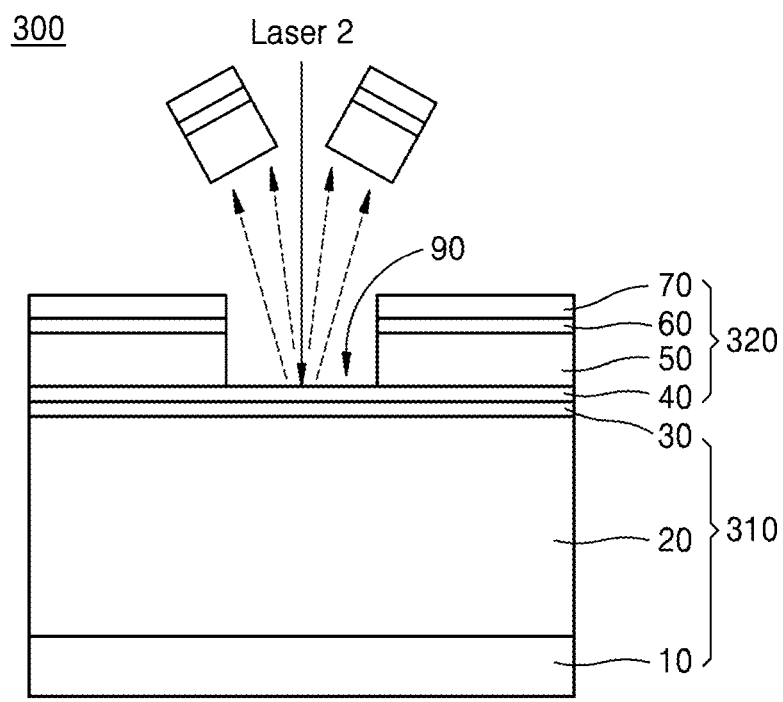

FIG. 4 is a cross-sectional view for describing a method of manufacturing a multi-junction solar cell 300, according to another embodiment of the present invention.

Referring to FIG. 4, long-wavelength pulsed laser beams Laser2 are irradiated onto the second transparent electrode layer 70. The long-wavelength pulsed laser beams Laser2 pass sequentially through the second transparent electrode layer 70, the buffer layer 60, and the second absorption layer 50 and are partially absorbed into the first transparent electrode layer 40. As a result, due to rapid thermal expansion of the first transparent electrode layer 40, impact may be generated at an interface between the first transparent electrode layer 40 and the second absorption layer 50, the second absorption layer 50, the buffer layer 60, and the second transparent electrode layer 70 may be delaminated, and thus the second cell 320 may be partially removed to generate the plurality of recesses 90. In this case, the first transparent electrode layer 40 may be partially or completely removed.

The laser beams may include ps or nanosecond (ns) pulsed laser beams having a wavelength band equal to or higher than 800 nm corresponding to a long-wavelength band not absorbed by the second absorption layer 50, and preferably, a wavelength band equal to or higher than 950 nm, e.g., 1064 nm.

Laser beams having a certain or higher energy level and a certain or larger diameter are used to cause thermal impact at the interface between the first transparent electrode layer 40 and the second absorption layer 50 and to lift off thin-film materials on the first transparent electrode layer 40 in a single process. In this case, the laser beams may have a diameter equal to or greater than 50 μm, and preferably, a diameter equal to or greater than 70 μm. When the laser beams have a sufficiently large diameter, excellent lift-off performance may be achieved and a production speed may be increased based on a high-speed process of 1 m/s to 20 m/s.

Figure 5:
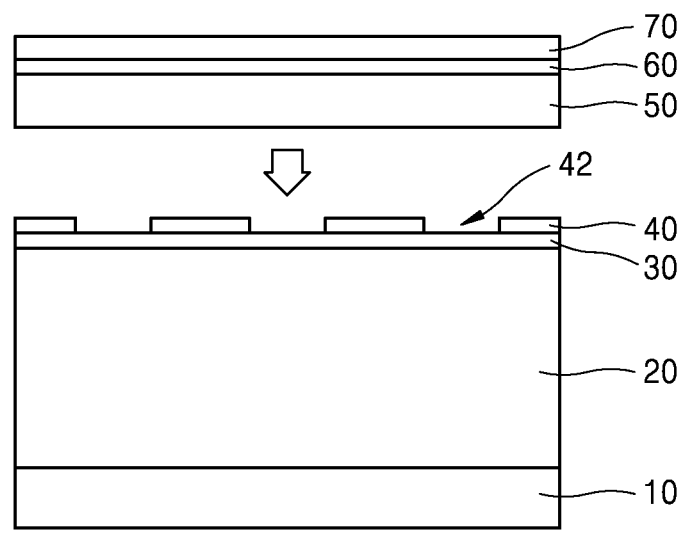
FIG. 5 is a cross-sectional view for describing a method of manufacturing a multi-junction solar cell, according to another embodiment of the present invention.
Figure 5:
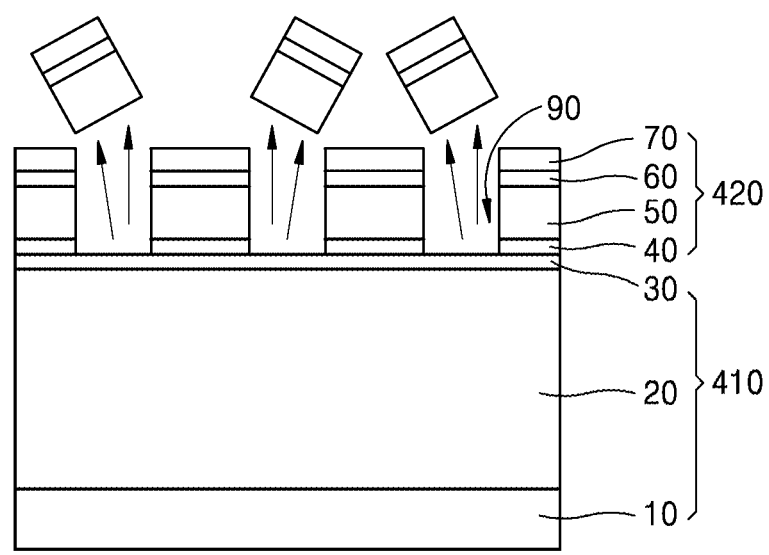

FIG. 5 is a cross-sectional view for describing a method of manufacturing a multi-junction solar cell 400, according to another embodiment of the present invention.

Referring to FIG. 5, when an electrode pattern 42 is generated by selectively removing the first transparent electrode layer 40 and then the second absorption layer 50, the buffer layer 60, and the second transparent electrode layer 70 are generated thereon, the first transparent electrode layer 40 achieves a high interfacial bonding strength with the second absorption layer 50 but a top surface of the emitter layer 30 exposed due to removal of the first transparent electrode layer 40 has a very low interfacial bonding strength. Due to various types of stress or artificial vibration or heating in subsequent processes, the interface between the emitter layer 30 and the second absorption layer 50 is easily selectively separated and removed and the plurality of recesses 90 are generated.

Test examples will now be described to promote understanding of the present invention. However, the following test examples are merely to promote understanding of the present invention and the present invention is not limited thereto.

An ITO transparent electrode layer is generated on a p-type Si-based solar cell in which a back electrode, a first absorption layer, and an emitter layer are sequentially stacked on one another, and a multi-junction solar cell sample is manufactured by sequentially depositing CuGaSe$_2$ (CGSe), CdS, and AZO thereon. Thereafter, external quantum efficiency (EQE) and reflectance spectrums of a top cell and a bottom cell are measured and compared. In addition, reflectance, transmittance, and absorbance spectrums of the ITO thin-film are measured and compared.

Figure 6:
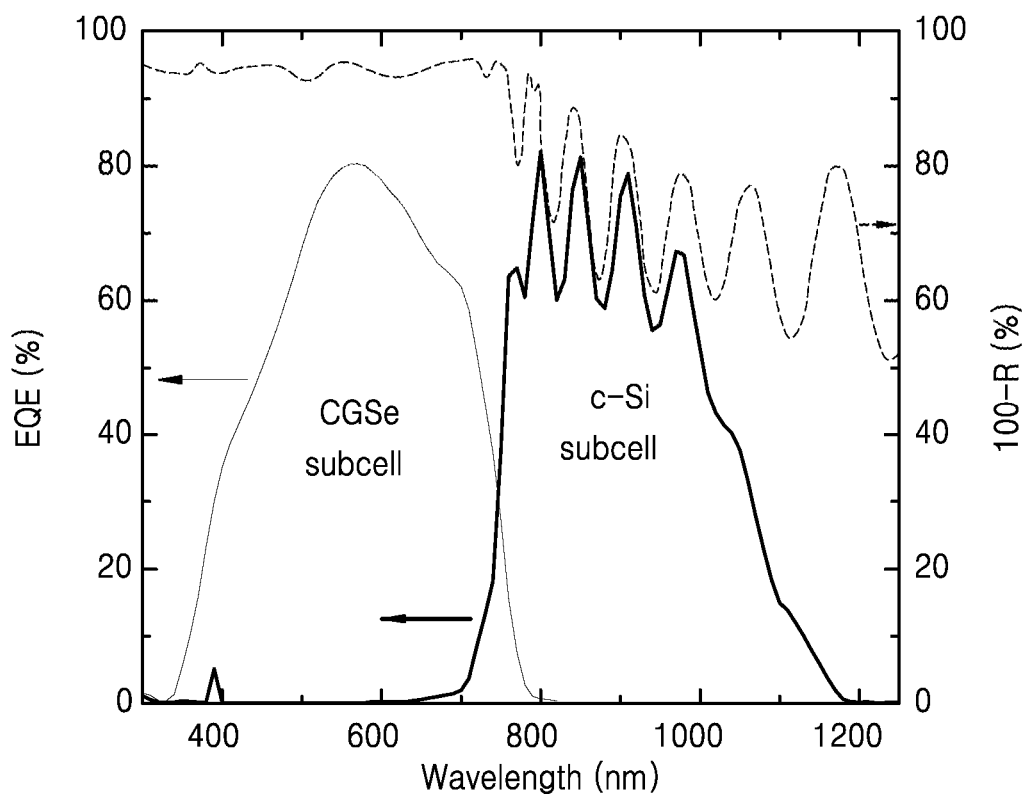
FIG. 6 is a graph showing external quantum efficiency (EQE) and reflectance spectrums of a multi-junction solar cell sample according to a comparative example.

FIG. 6 is a graph showing EQE and reflectance spectrums of a multi-junction solar cell sample according to a comparative example.

Referring to FIG. 6, a maximum quantum efficiency (QE) of a CGSe absorption layer is about 80% and a maximum QE of a Si solar cell is also about 80%. However, loss occurs due to strong reflection interference. When compared with surface reflectances, the reflectance is maintained very low at a wavelength band absorbed by the CGSe absorption layer, but reflection loss is greatly increased at a wavelength band equal to or lower than a CGSe bandgap.

That is, in spite of a sufficient absorbance, QE loss of CGSe is inferred as being caused by large electrical collection loss. On the other hand, QE loss of the Si solar cell is inferred as being mostly caused by absorption loss due to surface and interface reflection. Therefore, a technology capable of suppressing long-wavelength reflection loss need to be developed. However, referring back to FIG. 1B, even when performance of each solar cell is improved, a photocurrent of the Si solar cell in the combination of the Si solar cell and the CGSe solar cell is inevitably low, photocurrent matching is required.

Figure 7:
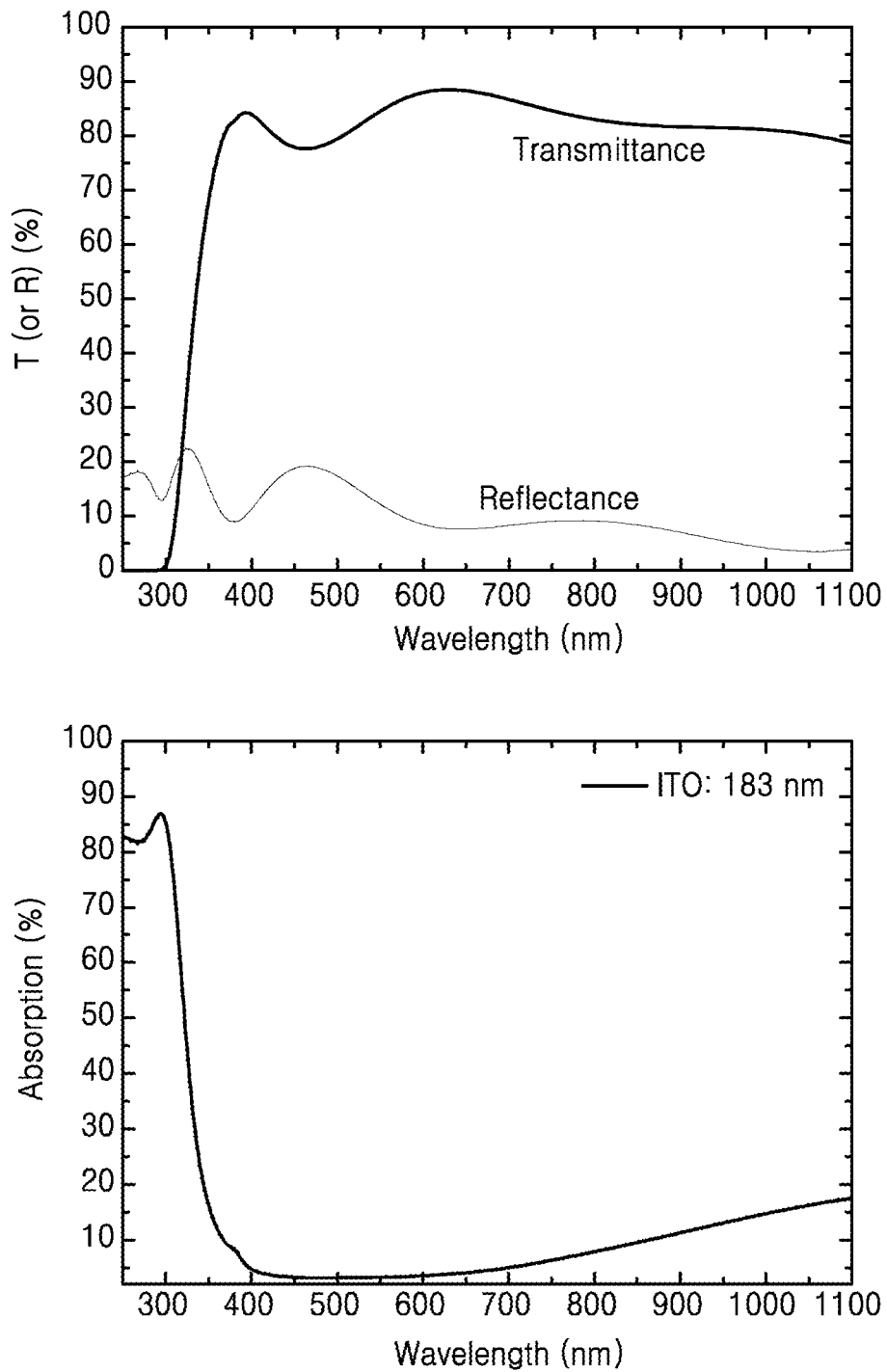
FIG. 7 shows graphs showing transmittance, reflectance, and absorbance spectrums of an indium tin oxide (ITO) thin-film (thickness: 183 nm)

FIG. 7 shows graphs showing transmittance, reflectance, and absorbance spectrums of an ITO thin-film (thickness: 183 nm).

Referring to FIG. 7, the ITO thin-film has a very low absorbance at a wavelength band of 532 nm and has a high absorbance at a long-wavelength band equal to or higher than 900 nm. Therefore, when laser beams of the wavelength band of 532 nm are irradiated, the absorbance of the ITO thin-film is remarkably lower than that of a CGSe absorption layer and thus loss of a Si solar cell under the ITO thin-film may be suppressed in a process of vaporizing the CGSe absorption layer based on laser heating. On the other hand, using laser beams of the long-wavelength band, the absorbances of the ITO thin-film and the Si solar cell thereunder are higher than that of the CGSe absorption layer and thus the CGSe absorption layer/a buffer layer/an AZO thin-film may be removed based on interface heating using laser beams.

Figure 8A:
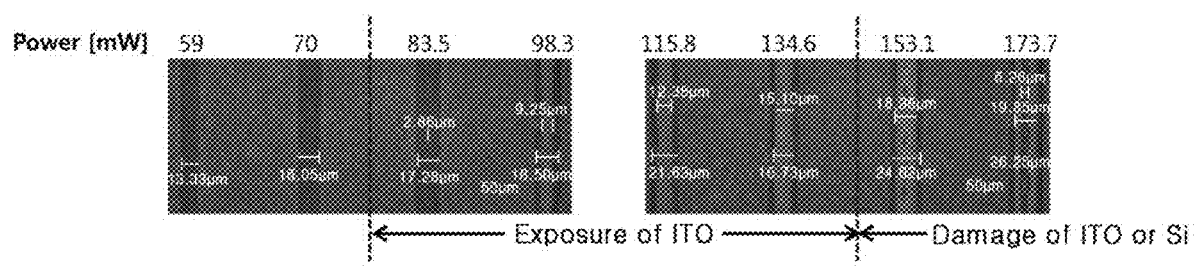
FIGS. 8A to 8G are images of a silicon (Si)/ITO/CuGaSe$_2$ (CGSe) structure processed using picosecond (ps) pulsed laser beams irradiated at different average powers.
Figure 8B:
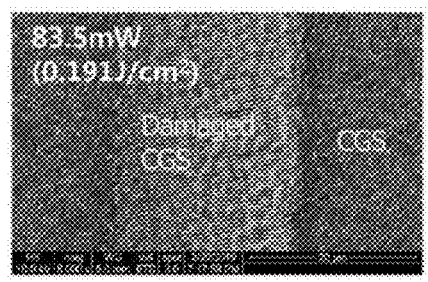
Figure 8C:
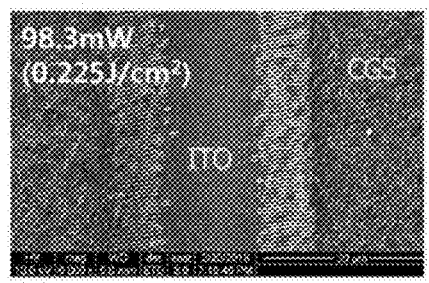
Figure 8D:
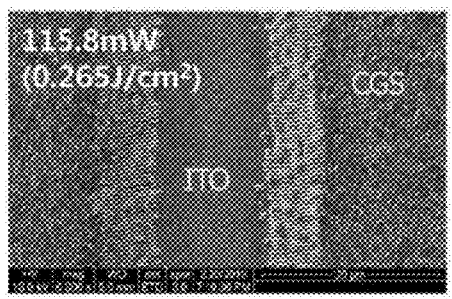
Figure 8E:
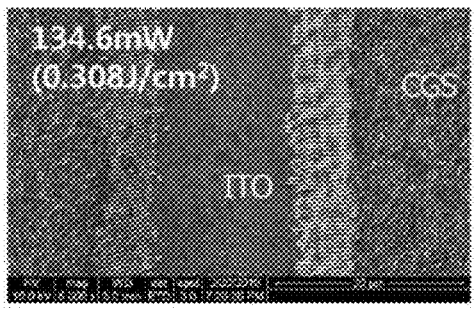
Figure 8F:
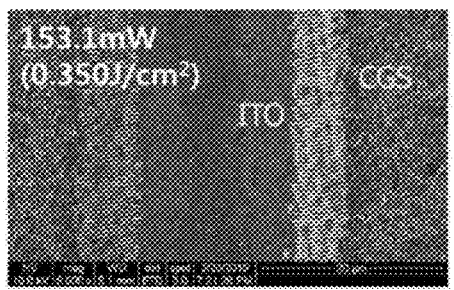
Figure 8G:
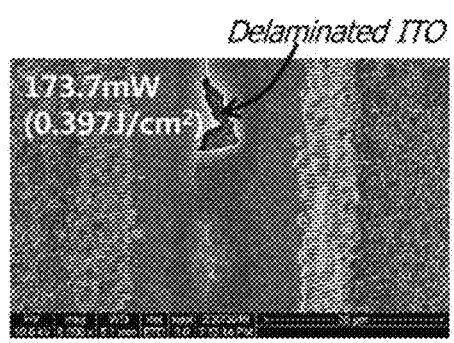

FIGS. 8A to 8G are images of a Si/ITO/CGSe structure processed using ps pulsed laser beams irradiated at different average powers. FIG. 8A shows optical microscopic images, and FIGS. 8B to 8G show scanning electron microscopic images.

FIGS. 8A to 8G are optical microscopic and scanning electron microscopic images of a Si/ITO/CGSe structure processed by irradiating ps laser beams having a wavelength of 532 nm, onto the CGSe absorption layer. Laser beams having a frequency of 100 kHz and a pulse width of 12 ps are focused to 23.6 μm and are irradiated by varying average power from 59 mW to 173.7 mW while moving at a speed of 50 mm/s. A pulse overlap ratio of the laser beams is about 98% on the basis of the distance between pulse centers. A removal amount of the CGSe absorption layer is increased as the average power is increased, and the CGSe absorption layer is removed to completely expose ITO at 98.3 mW (0.225 J/cm$^2$). As the power is increased, damage of the ITO thin-film is slightly increased and ITO starts to be delaminated at 173.7 mW (0.397 J/cm$^2$). The CGSe absorption layer is selectively removed without damage of ITO at a laser power density ranging from 0.225 J/cm$^2$ to 0.35 J/cm$^2$. Although processing conditions may slightly very depending on the diameter and the pulse overlap ratio of the laser beams, a sufficient laser process range may be ensured.

Figure 9A:
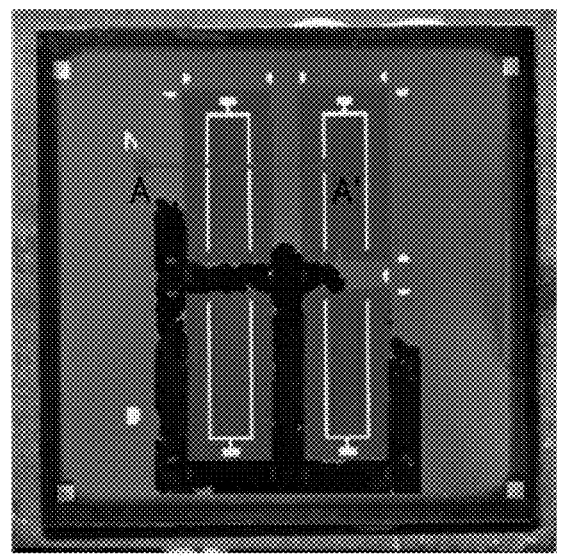
FIGS. 9A and 9B are a photographic image and a cross-sectional view of a multi-junction solar cell sample according to a test example of the present invention.
Figure 9B:
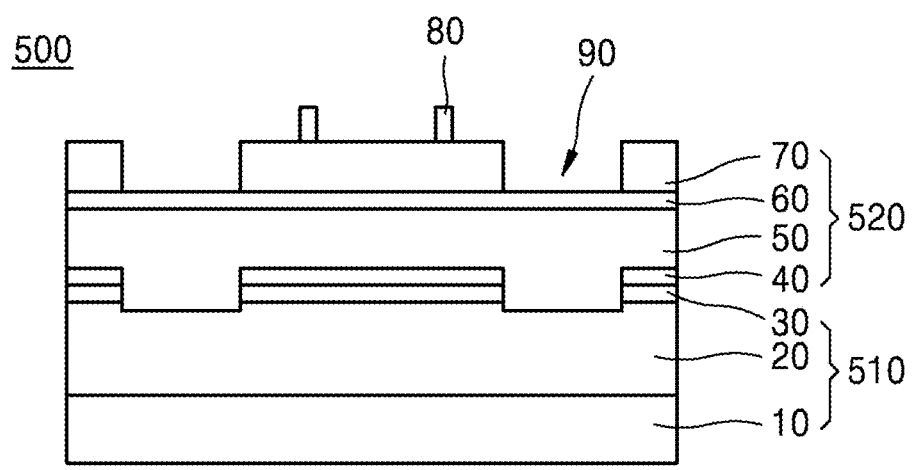
Figure 10A:
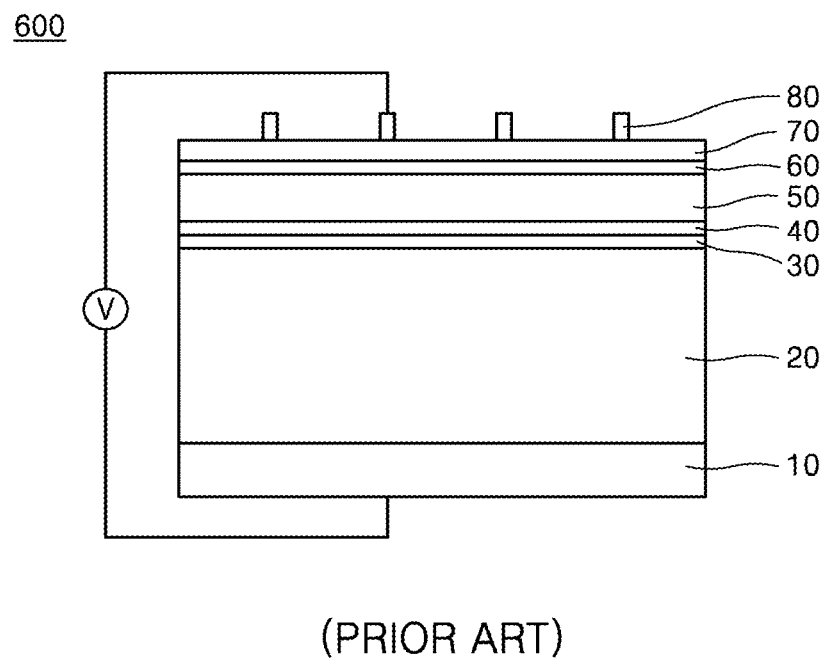
FIGS. 10A and 10B are a cross-sectional view showing a cell structure of a general hybrid multi-junction solar cell, and a graph showing EQE spectrums of a top cell and a bottom cell.
Figure 10B:
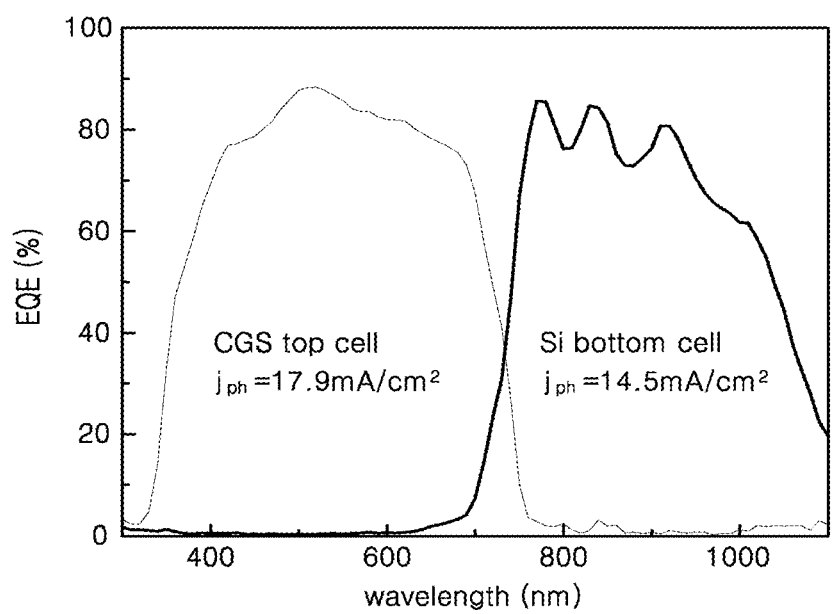

FIGS. 9A and 9B are a photographic image and a cross-sectional view of a multi-junction solar cell sample 500 according to a test example of the present invention. FIG. 9A is a photographic image of the sample 500 manufactured by selectively etching and patterning an ITO thin-film deposited on a Si solar cell, and then generating a CGSe absorption layer thereon, and FIG. 9B is a cross-sectional view of the sample 500 cut along line A-A' of FIG. 9A.

Referring to FIGS. 9A and 9B, although any external force is not applied after a subsequent process is completed, the CGSe absorption layer is delaminated in a large area of a region where the ITO thin-film is removed to expose Si, which means a Si/CGSe interface is very vulnerable. Using the above-described feature, a top cell may be selectively removed by merely patterning the ITO thin-film without a laser process or a photolithography process.

Using the above-described method of manufacturing a multi-junction solar cell, according to the present invention, a high-efficiency hybrid multi-junction solar cell may be manufactured at a high production speed by controlling photocurrents of a top cell and a bottom cell to be equal. However, the scope of the present invention is not limited to the above-described effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A multi-junction solar cell in which two or more absorption layers having different bandgaps are stacked on one another, the multi-junction solar cell comprising:
    a first cell comprising a first absorption layer; and
    a second cell electrically connected in series onto the first cell,
    wherein the second cell comprises:
    a second absorption layer having a higher bandgap compared to the first absorption layer; and
    a plurality of recesses penetrating through the second absorption layer,
    wherein the first cell and the second cell are stacked on one another by a first transparent electrode layer so that current flows through the first cell and the second cell, and
    wherein centers of the plurality of recesses penetrate through both of a buffer layer generated on the second absorption layer and a second transparent electrode layer generated on the buffer layer, the centers being aligned in a row.

2. The multi-junction solar cell of claim 1, wherein the first cell comprises a silicon (Si) solar cell.

3. The multi-junction solar cell of claim 1, wherein the second cell comprises a chalcogenide-based solar cell.

4. The multi-junction solar cell of claim 1, wherein at least parts of the first transparent electrode layer are exposed by the plurality of recesses.

5. The multi-junction solar cell of claim 1, wherein the plurality of recesses are designed to have a diameter in such a manner that the first and second cells generate equal photocurrents.

6. The multi-junction solar cell of claim 1,
wherein a removal area of the second transparent electrode layer is greater than or equal to a removal area of the second absorption layer.

7. The multi-junction solar cell of claim 1, further comprising an emitter layer between the first absorption layer and the second absorption layer.

8. The multi-junction solar cell of claim 7, wherein the first transparent electrode layer extends continuously across the plurality of recesses.

9. The multi-junction solar cell of claim 1, wherein at least parts of an emitter layer are exposed by the plurality of recesses.

10. The multi-junction solar cell of claim 1, wherein a pair of the plurality of recesses sandwiches a section of the second cell to expose each of two opposites sides of the second absorption layer in the section, two opposites sides of the buffer layer on the second absorption layer in the section, and two opposite sides of the second transparent electrode layer on the buffer layer in the section.

* * * * *